(12) United States Patent
Worley et al.

(10) Patent No.: US 9,083,176 B2
(45) Date of Patent: Jul. 14, 2015

(54) ELECTROSTATIC DISCHARGE CLAMP WITH DISABLE

(71) Applicant: QUALCOMM Incorporated, San Diego, CA (US)

(72) Inventors: Eugene Robert Worley, Irvine, CA (US); Sreeker Dundigal, San Diego, CA (US); Evan Siansuri, San Diego, CA (US); Reza Jalilizeinali, Oceanside, CA (US); Michael Brunolli, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 258 days.

(21) Appl. No.: 13/740,102

(22) Filed: Jan. 11, 2013

(65) Prior Publication Data
US 2014/0198414 A1   Jul. 17, 2014

(51) Int. Cl.
*H02H 9/00* (2006.01)
*H02H 9/04* (2006.01)
*G06F 1/30* (2006.01)
*H01L 23/62* (2006.01)

(52) U.S. Cl.
CPC ............ *H02H 9/046* (2013.01); *G06F 1/305* (2013.01); *H01L 23/62* (2013.01); *H02H 9/043* (2013.01)

(58) Field of Classification Search
USPC .......................................... 361/56
See application file for complete search history.

(56) References Cited

U.S. PATENT DOCUMENTS

| 5,877,927 | A * | 3/1999 | Parat et al. ...................... 361/56 |
| 7,164,565 | B2 * | 1/2007 | Takeda ............................. 361/56 |
| 8,726,046 | B2 * | 5/2014 | Tajima ............................ 713/300 |
| 2007/0247772 | A1 | 10/2007 | Keppens et al. |
| 2009/0040671 | A1 | 2/2009 | Zhang |
| 2011/0096446 | A1 | 4/2011 | Croft |
| 2011/0317316 | A1 | 12/2011 | Mozak et al. |
| 2012/0127618 | A1 | 5/2012 | Hong |

* cited by examiner

*Primary Examiner* — Ronald W Leja
(74) *Attorney, Agent, or Firm* — Paul S. Holdaway

(57) ABSTRACT

In a particular embodiment, a circuit includes a power supply, a ground, and a clamping transistor circuit coupled to the power supply and to the ground. The circuit further includes a disable clamp circuit. The disable clamp circuit is coupled to the power supply and is responsive to a second power supply input to selectively disable the clamping transistor circuit by modifying a charging current applied to a capacitor of the clamping transistor circuit. In a particular embodiment, modifying the charging current includes enabling a second charging path. Enabling the second charging path enables charging the capacitor at a higher charging rate than a charging rate associated with charging the capacitor via a first charging path.

30 Claims, 5 Drawing Sheets

ELECTROSTATIC DISCHARGE CLAMP WITH DISABLE

I. FIELD OF THE DISCLOSURE

The present disclosure is generally directed to a clamp circuit.

II. BACKGROUND

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, wireless telephones can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Such computing devices may include circuits (e.g., circuits included in a semiconductor device) that are susceptible to damage from an electrostatic discharge (ESD) event (such as during fabrication, packaging, or handling of the device). For example, a current caused by the ESD event may damage or destroy gate oxide, metallization, or junctions of electronic components. Damage caused by the ESD event may reduce manufacturing yields or cause operational failures of the electronic components and devices. Resistor-capacitor (RC) ESD clamps are designed to respond to ESD voltage transients. The RC ESD clamp is configured to be triggered (e.g., activated) to conduct a current between a power supply (e.g., a conductor, a line, or a "rail" that may be coupled to a power source to provide power to an unpowered circuit) and ground in response to an ESD voltage between the power supply and the ground. The RC ESD clamp is configured to conduct the current from the power supply to the ground for a time period on the order of a few microseconds (µs) during an ESD event.

During a typical (i.e., a non-ESD) power-up of a power source coupled to the power supply, the RC ESD clamp is not triggered. A power source may have a relatively long power-up time (e.g., on the order of 10 µs or greater), such as due to charging of a large bypass capacitor, that is longer than the time period of the ESD event. However, increasing performance demands of computer devices have created a need for power sources having a shorter power-up time than the typical power-up time. For example, many wireless telephones power down components (e.g. circuits or processors) when not in use (e.g., enter a standby mode or a power-down mode). It may be desirable for a wireless telephone to have a fast power-up when returning to a powered mode to increase performance.

A fast power-up (e.g., a power-up time that is shorter than a typical power-up time) may cause the RC ESD clamp to momentarily trigger and conduct current between the power supply and the ground, thus encumbering the fast power-up of the power source. For example, the fast power-up of the power source may be part of a power-up sequence associated with the integrated circuit including the RC ESD clamp. Because RC ESD clamps are configured so that large amounts of current (e.g., several amps) may be conducted during the ESD event, triggering the RC ESD clamp during a non-ESD power-up results in increased power consumption, an increased delay in the power-up of the power source, and possible damage to the RC clamp and other circuit elements since energy associated with the power-up may be much greater than energy during an ESD discharge.

III. SUMMARY

A circuit includes a disable clamp circuit configured to selectively disable a clamping transistor circuit during a power-up of a power source coupled to a power supply. Selectively disabling the clamping transistor circuit during the power-up may prevent the clamping transistor circuit from encumbering (e.g., limiting) a fast power-up of the power source (e.g., a power-up time that is shorter (e.g., less) than an RC time constant of the clamping transistor circuit). The fast power-up of a power source may be part of a power-up sequence associated with an integrated circuit including the circuit. For example, the power-up sequence may include powering on a second power source and allowing the second power source to reach a steady operating voltage. After the second power source reaches the steady operating voltage, the fast power-up of the first power source may be initiated.

The disable clamp circuit may be responsive to a second power supply (e.g., a conductor or a line coupled to the second power source) to selectively disable the clamping transistor circuit by modifying a charging current applied to a capacitor of the clamping transistor circuit. For example, prior to modification, the charging current applied to the capacitor may flow via a first charging path. Modifying the charging current may include enabling a second charging path that is a parallel path to the first charging path. The second charging path may be a lower resistance charging path than the first charging path. Enabling the second charging path enables charging of the capacitor at a higher (e.g., faster) charging rate than a charging rate associated with the first charging path. When the voltage across the capacitor reaches a voltage threshold, a low resistance shunt path of the clamping transistor circuit may be isolated from the power supply, thus disabling the clamping transistor circuit.

The fast power-up of the power source may be applied to an integrated circuit disposed on a semiconductor die coupled to a package substrate. The semiconductor die may include one or more conductive bumps (e.g., contacts and/or inputs) on a surface of the semiconductor die, and the one or more conductive bumps are coupled to the package substrate. The one or more conductive bumps may be shorted together via a metal layer of the package substrate to create a low resistance power plane. The power supply may be coupled to the conductive bumps to provide a voltage (e.g., a voltage Vdd from the power source) associated with a fast power-up. A circuit within the integrated circuit may protect against damage to a clamp circuit caused by an ESD event during wafer sort, manufacturing, or handling. For example, an ESD event may be caused when a handler or a testing instrument comes within close proximity of, and discharges static electricity to, the one or more conductive bumps or the metal layer of the package substrate.

In a particular embodiment, the circuit includes a power supply, a ground, and a clamping transistor circuit coupled to the power supply and to the ground. The circuit further includes a disable clamp circuit. The disable clamp circuit is coupled to the power supply and is responsive to a second power supply to selectively disable the clamping transistor circuit by modifying (e.g., increasing) a charging current applied to a capacitor within the clamping transistor circuit.

In another particular embodiment, a method includes receiving a power supply signal at a disable clamp circuit. The disable clamp circuit is coupled to a power supply. The method also includes selectively disabling a clamping circuit in response to receiving the power supply signal at the disable clamp circuit by modifying a charging current applied to a capacitor of the clamping circuit. The clamping circuit is coupled to the power supply.

In another particular embodiment, an apparatus includes means for clamping that is coupled to a power supply and to ground. The apparatus also includes means for selectively disabling the means for clamping in response to a power supply input by modifying a charging current applied to a capacitor of the means for clamping. The means for selectively disabling is coupled to the power supply.

In another particular embodiment, a non-transitory computer readable medium includes instructions that, when executed by a processor, cause the processor to provide, to a disable clamp circuit coupled to a power supply and to ground, a disable signal based on a second power supply input. A clamping transistor circuit is coupled to the power supply and to ground. The disable clamp circuit is responsive to the disable signal to selectively disable the clamping transistor circuit by modifying a charging current applied to a capacitor of the clamping transistor circuit.

One particular advantage provided by one or more of the disclosed embodiments is a clamp circuit including a disable clamp circuit and a clamping transistor circuit that are able to prevent or reduce damage caused by an ESD event without encumbering a fast power-up of a power source. During the fast power-up, the disable clamp circuit may enable a second charging path and charge a capacitor of the clamping transistor circuit at a higher charging rate (as compared to a charging rate associated with a first charging path). Charging the capacitor at the higher charging rate may prevent the clamping transistor circuit from shunting current from a power supply to ground via a low resistance shunt path. Preventing the clamping transistor circuit from shunting current during the fast power-up may prevent an increase in power consumption, may reduce a power up delay associated with the fast power-up, and may protect against possible damage to the clamp circuit (e.g., damage to an RC clamp). Another particular advantage is that components (e.g., transistors) of the disable clamp circuit are relatively small compared to other components within the clamp circuit. Thus, disable functionality may be provided with a small increase in the circuit area of the clamp circuit.

Other aspects, advantages, and features of the present disclosure will become apparent after review of the application, including the following sections: Brief Description of the Drawings, Detailed Description, and the Claims.

IV. BRIEF DESCRIPTION OF THE DRAWINGS

V. DETAILED DESCRIPTION

Figure 1:
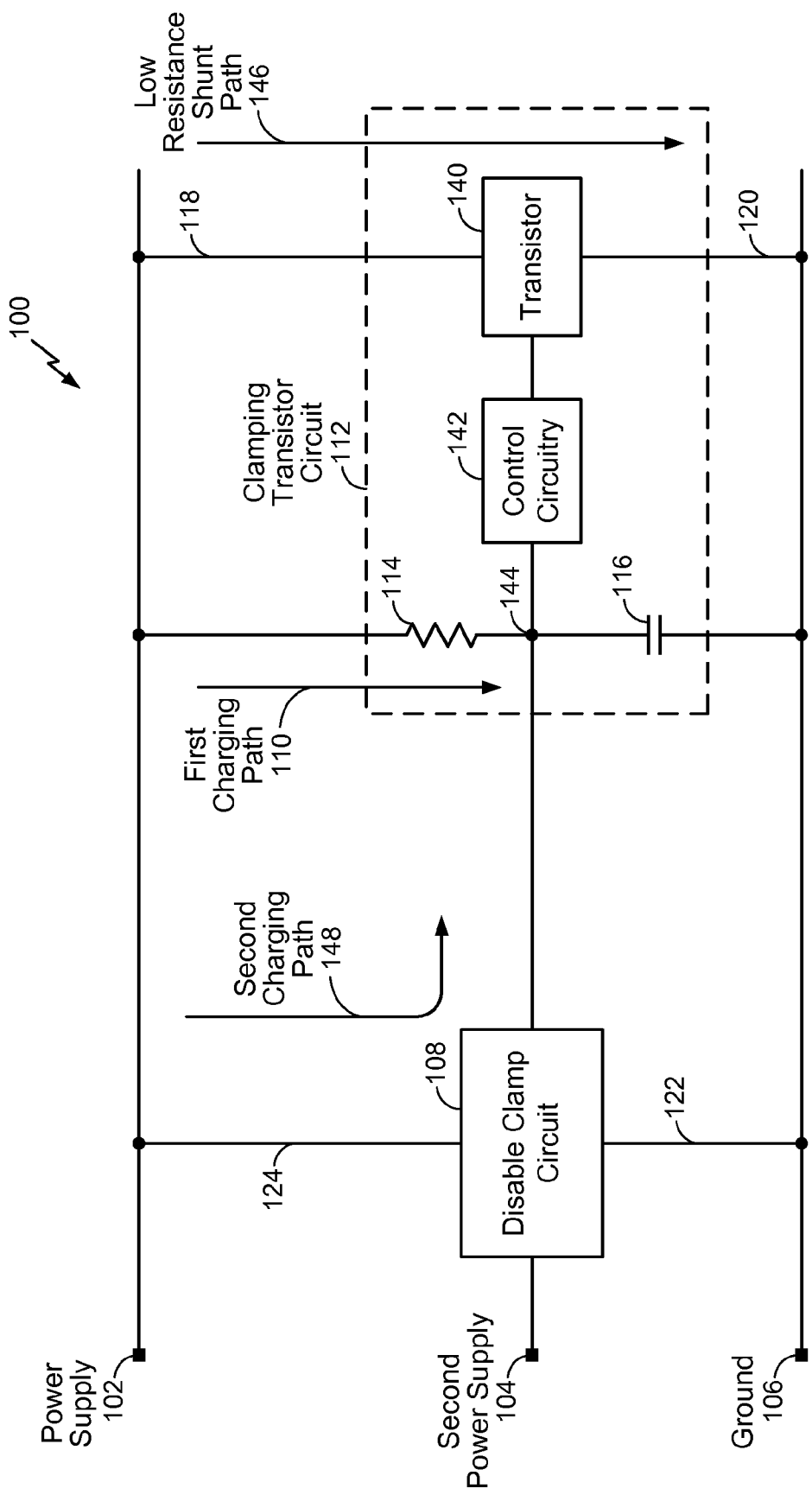
FIG. 1 is a circuit diagram of a first illustrative embodiment of a clamp circuit including a disable clamp circuit and a clamping transistor circuit.

FIG. 1 illustrates a first illustrative embodiment of a clamp circuit 100 that may be used as an electrostatic discharge (ESD) clamp. The clamp circuit 100 includes a disable clamp circuit 108 and a clamping transistor circuit 112 coupled between a power supply 102 (e.g., a power supply terminal coupled to a power supply rail) and ground 106 (e.g., a ground terminal coupled to a ground rail).

The clamping transistor circuit 112 may be configured to operate in accordance with multiple operating mode (e.g., charging rates of a capacitor 116 of the clamping transistor circuit 112) based on a power status of the clamp circuit 100. For example, the clamping transistor circuit 112 may operate in accordance with a first operating mode (e.g., in which the capacitor 116 has a first charging rate, as further described herein) when the clamp circuit 100 is unpowered or when a voltage of the power supply 102 has reached a steady operating voltage (e.g., a standby voltage or a normal operating voltage). When the clamping transistor circuit 112 is operating in accordance with the first operating mode, the clamping transistor circuit 112 may be configured to prevent or reduce damage to a semiconductor device during an ESD event associated with the power supply 102.

As another example, the clamping transistor circuit 112 may operate in accordance with a second operating mode during a power-up of a power source (not shown) coupled to the clamp circuit 100 via the power supply 102. As used herein, a power-up of the power supply 102 refers to a rising voltage measureable on the power supply 102 (e.g., the rising voltage during the power-up of the power source). For example, the voltage of the power supply 102 may reach a steady operating voltage after a power-up from a first power state to a second power state that has a higher voltage than the first power state. During the power-up of the power supply 102, the disable clamp circuit 108 may cause the clamping transistor circuit 112 to be disabled. The capacitor 116 has a second charging rate during the second operating mode. The second charging rate may be faster than a rate of voltage increase of the power-up, and the first charging rate may not be faster than the rate of voltage increase of the power-up. Disabling the clamping transistor circuit 112 during the power-up may prevent an increase in power consumption or a delay associated with the clamping transistor circuit 112 during the power-up.

The power supply 102 may include a conductive wire, a line, a network, or a "rail" configured to be biased by a supply voltage. For example, the power supply 102 may be a terminal and/or line connected to the power source (not shown) and configured to be biased by a supply voltage from the power source. The power source may include a voltage source, such as a battery or an alternating current (AC) to direct current (DC) transformer. The ground 106 may include a terminal and/or line connected to a common ground (e.g., a ground network). As used herein, the power supply 102 does not include the power source and the ground 106 does not include the common ground. During the power-up of the power source, voltage from the power source rises (e.g., increases) on the power supply 102 until the power source reaches a steady operating level.

The clamping transistor circuit 112 may be coupled to the power supply 102 and to the ground 106. The clamping transistor circuit 112 may include a resistor 114, the capacitor 116, control circuitry 142, a transistor 140, and a node 144. The resistor 114, the node 144, and the capacitor 116 may be coupled in series between the power supply 102 and the ground 106. The clamping transistor circuit 112 may include a resistor-capacitor (RC) clamp circuit that includes the resistor 114, the node 144, and the capacitor 116. The control circuitry 142 may be coupled between the node 144 and the transistor 140. In a particular embodiment, the control circuitry 142 includes one or more inverters (e.g., a single inverter or a triple inverter).

The control circuitry 142 may receive a voltage value of the node 144 and may provide an inverted voltage value to a gate of the transistor 140. The transistor 140 may be coupled to the power supply 102 via a first line 118 (e.g., a first conductor) and to the ground 106 via a second line 120 (e.g., a second conductor). The transistor 140 may be responsive to the inverted voltage value to enable current to flow (e.g., travel) via a low resistance shunt path 146 (e.g., a current path). In a particular embodiment, the low resistance shunt path 146 includes the first line 118, the transistor 140, and the second line 120. A resistance value of the low resistance shunt path 146 may be determined based on a size of the transistor 140, and the transistor 140 may be sized such that the resistance value is sufficiently low.

When the clamp circuit 100 is unpowered (e.g., the clamping transistor circuit 112 is operating in accordance with the first operating mode), the circuit 100 is inactive. The capacitor 116 may be at an uncharged state (e.g., not charged) and the transistor 140 may be disabled. During an ESD event associated with the power supply 102, the ESD event may cause a voltage between the power supply 102 and the ground 106. A voltage value at the node 144 (e.g., a voltage potential across the capacitor 116) may initially correspond to a logical low value based on the capacitor 116 being in the uncharged state, and the control circuitry 142 may output a logical high value to the transistor 140. A logical low value may be associated with a voltage value that is less than an activation voltage (e.g., a turn on voltage) of the transistor 140, and a logical high value may be associated with a voltage value that is greater than or equal to the activation voltage. The logical high value output by the control circuitry 142 may enable the transistor 140 to establish a low resistance shunt path 146. During the ESD event, the clamping transistor circuit 112 may shunt current from the power supply 102 to the ground 106 via the low resistance shunt path 146.

During the ESD event, as current flows via the low resistance shunt path 146, a charging current may be applied to the capacitor 116 via a first charging path 110. The charging current may flow via the first charging path 110 concurrently with the current flowing via the low resistance shunt path 146. For example, the first charging path 110 may include a line (e.g., a conductor) that couples the power supply 102 to the resistor 114 and includes the resistor 114. The capacitor 116 may be charged at a first charging rate that is determined based on a first RC time constant of the clamping transistor circuit 112. The first RC time constant may be determined based on a size of the resistor 114, a size of the capacitor 116, or a combination thereof, and the RC time constant may be set to correspond to a duration of the ESD event. The duration of the ESD event may be determined based on a Joint Electronic Devices Engineering Council (JEDEC) Human Body Model (HBM) standard or a Charged Device Model (CDM) standard.

In a particular embodiment, the charging current applied to the capacitor is an amount of current flowing from the node 144 to the capacitor 116. After the charging current charges the capacitor 116 to a threshold charge value (e.g., a voltage to cause the control circuitry 142 to output a value that deactivates the transistor 140), the transistor 140 may be disabled by the control circuitry 142. For example, the capacitor 116 being charged to the threshold charge value may cause the voltage at the node 144 to be a logical high value, and the control circuitry 142 may invert the voltage at the node 144 and output a logical low value that disables the transistor 140. Disabling the transistor 140 may prohibit, or substantially reduce, current flow via the low resistance shunt path 146.

The disable clamp circuit 108 is coupled to the power supply 102, the ground 106, the second power supply 104, and the clamping transistor circuit 112 (e.g., via the node 144). The disable clamp circuit 108 may be coupled to the power supply 102 via a third line 124 (e.g., a conductor) and to the ground 106 via a fourth line 122 (e.g., a conductor).

The disable clamp circuit 108 may be responsive to a second power supply 104 to selectively enable a second charging path 148 via the disable clamp circuit 108. The second power supply 104 may be a conductor, line, or input terminal biased by a second bias voltage of a second power source (not shown). When a voltage of the second power supply 104 (e.g., a voltage from the second power source) is greater than or equal to a threshold input value, the disable clamp circuit 108 may be configured to enable the second charging path 148. The second charging path 148 may include a current path from the power supply 102 to the node 144 via the disable clamp circuit 108. Enabling the second charging path 148 increases the charging rate of the capacitor 116 from the first charging rate to the second charging rate, as described further herein. When the voltage of the second power supply is below the threshold input value, the disable clamp circuit 108 may be configured to disable (e.g., not enable) the second charging path 148 and the clamping transistor circuit 112 may operate in accordance with the first operating mode. When the second charging path 148 is disabled, the capacitor 116 may be charged by the charging current flowing via the first charging path 110 (as previously described).

Figure 2:
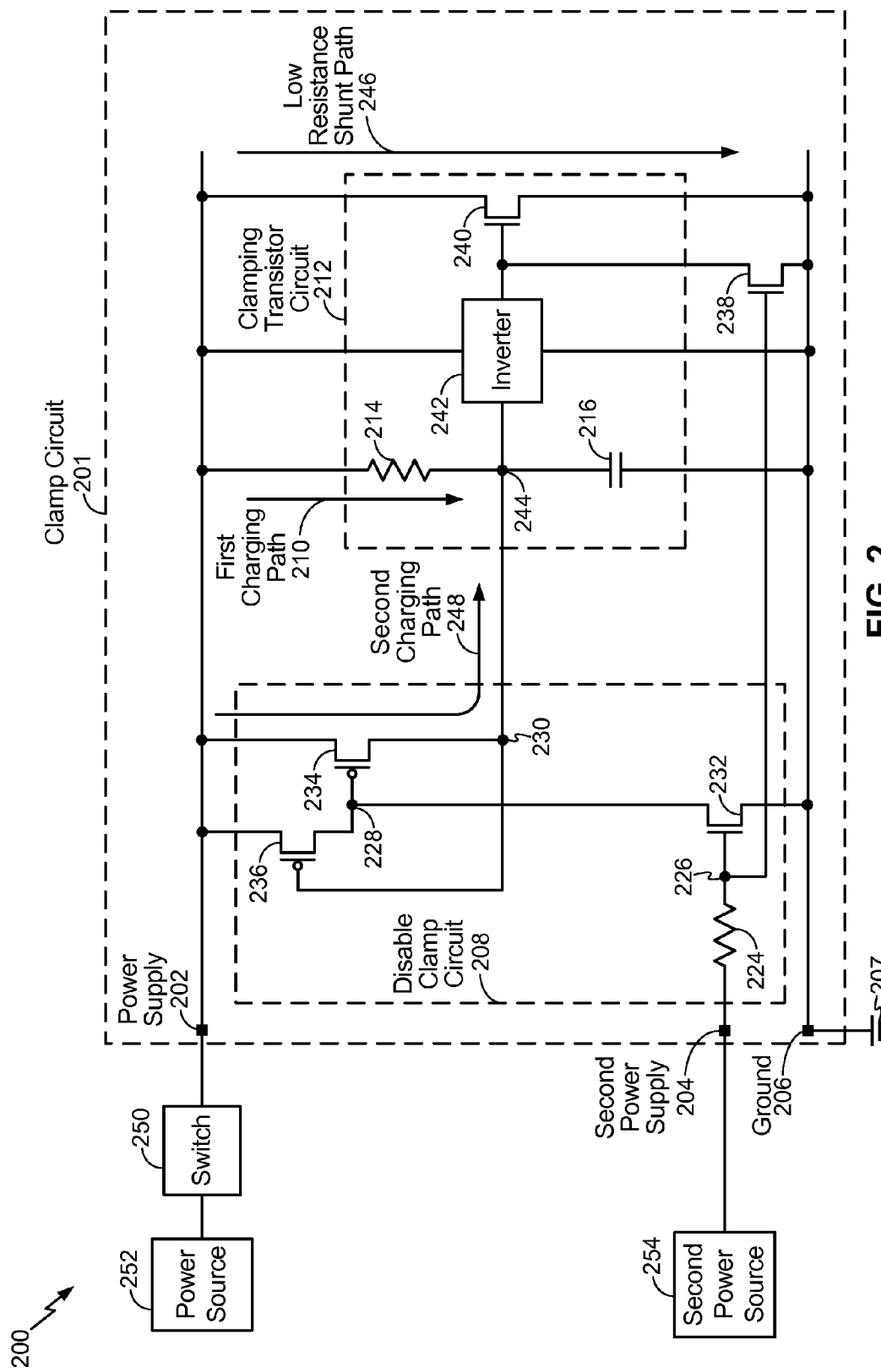
FIG. 2 is a circuit diagram of a first illustrative embodiment of a circuit having a clamp circuit that includes a disable clamp circuit and a clamping transistor circuit.

During a power-up of the power supply 102 (e.g., when the clamping transistor circuit 112 is operating in accordance with the second operating mode), the voltage of the second power supply 104 may rise (e.g., increase) above the threshold input value and the disable clamp circuit 108 may be configured to enable the second charging path 148, as described further with reference to FIG. 2. Enabling the second charging path 148 may modify (e.g., change) the charging current applied to the capacitor 116 (e.g., the current from the node 144 to the capacitor 116). The second charging path 148 may have a lower resistance than the first charging path 110. The second charging rate may be faster than the first charging rate (e.g., the charging rate associated with the charging current flowing solely via first charging path 110). The second charging rate may be determined based on the second charging path 148 individually or in combination with the first charging path 110, as described with reference to FIG. 2. For example, the second charging rate may be determined based on a second RC time constant that is smaller than the first RC time constant. The second charging rate may cause the transistor 140 to be disabled more quickly, preventing the clamping transistor circuit 112 from shunting current via the low resistance shunt path 146 during the power-up of the power supply 102. Preventing the clamping transistor circuit 112 from shunting current via the low resistance shunt path 146 during the power-up of the power supply 102 may prevent the clamping transistor circuit 112 from effecting (e.g., extending) a power-up time.

During operation, the clamp circuit 100 may be unpowered and inactive. The clamping transistor circuit 112 may operate in accordance with the first operating mode. When the clamp circuit 100 is unpowered, the voltage of the second power supply 104 may be below the threshold input value (e.g., the second power source is not enabled or coupled to the second power supply 104) and the disable clamp circuit 108 may not enable the second charging path 148. The capacitor 116 may be in the uncharged state and the transistor 140 may be disabled. The clamp circuit 100 may be included in an integrated circuit disposed on a semiconductor die coupled to a package substrate, and the power supply 102 may be coupled to one or more conductive bumps on a surface of the semiconductor die, as described further herein with reference to FIG. 2. During an ESD (e.g., an electric charge, such as from a static charge at the one or more conductive bumps or a metal layer of the package substrate) event, the control circuitry 142 may invert the logical low value at the node 144 and enable the transistor 140. The clamping transistor circuit 112 may be configured to concurrently shunt current via the low resistance shunt path 146 and apply charging current flowing via the first charging path 110 to the capacitor 116. The clamping transistor circuit 112 may shunt the current via the low resistance shunt path 146 until the capacitor 116 charges to the threshold charge value based on the first charging rate or until the ESD event is over. The clamping transistor circuit 112 may operate in a similar manner (e.g., in accordance with the first operating mode) when the power supply 102 has reached a steady operating voltage to prevent damage during ESD events.

During a power-up from the first power state to the second power state associated with the power supply 102, the clamping transistor circuit 112 may transition to operate in accordance with the second operating mode. For example, the power-up from the first power state to the second power state may refer to a power-up from the unpowered state to a standby state (e.g., a low power state), from the unpowered state to a normal operating state (e.g., a normal power state), or from the standby state to the normal operating state. The power-up may be part of a power-up sequence associated with the integrated circuit including the clamp circuit 100. For example, the power-up sequence may include powering on the second power source (not shown) coupled to the second power supply 104 and allowing the second power source to reach a steady operating voltage. After the second power source reaches the steady operating voltage (e.g., the voltage of the second power supply 104 increases to at least the threshold input value), the power-up of the power source (e.g., the power-up associated with the power supply 102) may be initiated. The disable clamp circuit 108 may enable the second charging path 148 in response to the voltage of the second power supply 104 reaching the threshold input value. Enabling the second charging path 148 may modify an amount of charging current applied to the capacitor 116. For example, the capacitor 116 may be charged at the second charging rate, thereby quickly disabling the transistor 140 to prohibit current flow via the low resistance shunt path 146 during the power-up.

The clamp circuit 100 provides a benefit by disabling the low resistance shunt path 146 during the power-up of the power supply 102 to prevent an encumbrance of the power-up. For example, the power-up of the power supply 102 may be characterized by a power-up time that is faster than a charge time of the capacitor 116 based on the first charging rate. Enabling the second charging path 148 may change the charging time of the capacitor 116 to a faster charging time based on the second charging rate. The faster charging time of the capacitor 116 may be faster than the power-up time of the power-up, resulting in the low resistance shunt path 146 being disabled during the power-up time of the power-up. Thus, the low resistance shunt path 146 may not affect the power-up of the power supply 102. The clamp circuit 100 provides an additional benefit by providing disable functionality (e.g., the disable clamp circuit 108) with only a small increase in circuit area of the clamp circuit 100. For example, components of the disable clamp circuit 108 may be small compared to components of the clamping transistor circuit 112, as described further herein with reference to FIG. 2.

Referring to FIG. 2, a first illustrative embodiment of a circuit 200 is disclosed. The circuit 200 may include a power source 252, a switch 250, a second power source 254, a ground network 207, and a clamp circuit 201. The clamp circuit 201 may correspond to a particular implementation of the clamp circuit 100 of FIG. 1.

The clamp circuit 201 may include a power supply 202 (e.g., a power supply terminal, a conductive wire, and/or line), a second power supply 204 (e.g., a power supply terminal, a conductive wire, and/or line), a ground 206 (e.g., a ground terminal, a conductive wire, and/or line), a disable clamp circuit 208, and a clamping transistor circuit 212. The power supply 202, the second power supply 204, the ground 206, the disable clamp circuit 208, and the clamping transistor circuit 212 may correspond to the power supply 102, the second power supply 104, the ground 106, the disable clamp circuit 108, and the clamping transistor circuit 112 of FIG. 1, respectively. The power supply 202 may be a power supply terminal coupled to power source 252 via the switch 250, as further described herein. The ground 206 may be a ground terminal coupled to the ground network 207 of the circuit 200, as further described herein.

The clamping transistor circuit 212 may be configured to operate in accordance with multiple operating modes, as described above with reference to the clamping transistor circuit 112 of FIG. 1. For example, a first operating mode of the clamping transistor circuit 212 may correspond to charging a capacitor 216 of the clamping transistor circuit 212 at a first charging rate, and a second operating mode may correspond to charging the capacitor 216 at a second charging rate, as described further herein.

The clamp circuit 201 may include the disable clamp circuit 208 coupled between the power supply 202 and the ground 206. The disable clamp circuit 208 may include a first transistor 232, a second transistor 234, a third transistor 236, a first resistor 224, a voltage input node 226, a first node 228, and a second node 230. In a particular embodiment, the first transistor 232 may be a negative channel field effect transistor (NFET) and the second transistor 234 and the third transistor 236 may each be positive channel field effect transistors (PFETs). The first transistor 232 may be coupled between the first node 228 and the ground 206. A gate of the first transistor 232 may be coupled to the voltage input node 226. The voltage input node 226 may also be coupled to a fourth transistor 238 of the clamp circuit 201, as further described below. The first resistor 224 may coupled between the second power supply 204 and the voltage input node 226. The first transistor 232 is responsive to a voltage at the voltage input node 226 that is associated with a voltage of the second power supply 204.

The second transistor 234 may be coupled between the power supply 202 and the second node 230. A gate of the second transistor 234 may be coupled to the first node 228. The second node 230 may be coupled to an input of the clamping transistor circuit 212. The second transistor 234 is responsive to a voltage at the first node 228. The third transistor 236 may be coupled between the power supply 202 and the first node 228. A gate of the third transistor 236 may be coupled to the second node 230. The third transistor 236 is responsive to a voltage at the second node 230. In particular embodiment, the second node 230 may be designated as an output of the disable clamp circuit 208.

The disable clamp circuit 208 may be responsive to the second power supply 204 to selectively enable a second charging path 248 via the disable clamp circuit 208. When a voltage of the second power supply (e.g., a voltage from the second power source 254) is below a threshold input value, the second charging path 248 may not be enabled to allow (e.g. does not permit) current flow via the disable clamp circuit 208. The threshold input value may be associated with an activation voltage of the first transistor 232 (e.g., a turn on voltage of the first transistor 232). When the second charging path 248 is disabled, a charging current applied to a capacitor 216 may be based on a first charging path 210, and not the second charging path 248, as further described herein.

When the voltage of the second power supply 204 is below the threshold input value, the first transistor 232 may be disabled and the third transistor 236 may be enabled (e.g., based on the capacitor 216 being in an uncharged state prior to an ESD event). By enabling the third transistor 236 during an ESD event, the first node 228 may receive a voltage of the power supply 202 (e.g., a voltage associated with the ESD event) and prevent the voltage at the first node 228 from floating due to the first transistor 232 being disabled. Preventing the voltage at the first node 228 from floating may prevent the second transistor 234 from being partially enabled during the ESD event and prevents a decrease of a first RC time constant of the clamping transistor circuit 212, as further described herein. For example, a floating voltage at the first node 228 may be subject to a drain-to-gate capacitance of the second transistor 234, which may lower the voltage at the first node 228 and partially enable the second transistor 234 during the ESD event.

When the voltage of the second power supply 204 is greater than or equal to the threshold input value, the disable clamp circuit 208 may be configured to enable the second charging path 248. For example, when the voltage at the voltage input node 226 is greater than or equal to the threshold input value (e.g., when the second power source 254 is activated and coupled to the second power supply 204), the first transistor 232 may turn on and provide a path between the first node 228 and the ground 206 (e.g., pull the voltage at the first node 228 to a logical low value). A logical low value at the first node 228 may turn on the second transistor 234 to provide a path between the second node 230 and the power supply 202 (e.g., raise the voltage at the second node 230 to a logical high value). A logical high value at the second node 230 may disable the third transistor 236 and the voltage at the first node 228 may remain at the logical low value. In response to the logical low value at the first node 228, the disable clamp circuit 208 may enable the second charging path 248. In a particular embodiment, the second charging path 248 includes the second transistor 234 and a conductor coupling the second transistor 234 to the power supply 202. Enabling the second charging path 248 may modify (e.g., change) the charging current applied to the capacitor 216 of the clamping transistor circuit 212, as further described below. For example, a current flowing via the second charging path 248 may be provided to the clamping transistor circuit 212.

The clamping transistor circuit 212 may include a second resistor 214, the capacitor 216, an input node 244, an inverter 242, and a fifth transistor 240. The second resistor 214, the capacitor 216, the input node 244, the inverter 242, and the fifth transistor 240 may correspond to the resistor 114, the capacitor 116, the node 144, the control circuitry 142, and the transistor 140 of FIG. 1, respectively.

The second resistor 214, the input node 244, and the capacitor 216 may be coupled in series between the power supply 202 and the ground 206. The clamping transistor circuit 212 may include a resistor-capacitor (RC) clamp circuit that includes the second resistor 214, the input node 244, and the capacitor 216.

In a particular embodiment, the input node 244 and the second node 230 may be a single node. The input node 244 is designated as an input of the clamping transistor circuit 212, the second node 230 is designated as an output of the disable clamp circuit 208, and the input node 244 is coupled to the second node 230 by a line (e.g., a connector). By connecting the input node 244 to the second node 230, the clamp circuit 201 provides the output of the disable clamp circuit 208 to the input of the clamping transistor circuit 212.

The inverter 242 may be coupled between the input node 244 and the fifth transistor 240. For example, the inverter 242 may comprise one or more inverters, such as a single inverter or three inverters connected in series (e.g., a triple inverter). The inverter 242 may receive a voltage value of the input node 244 and provide an inverted voltage value to a gate of the fifth transistor 240. The fifth transistor 240 may be coupled between the power supply 202 and the ground 206 and may be responsive to the inverted voltage value at the input node 244. For example, when the inverted voltage value is a logical high value (e.g., a voltage greater than an activation voltage of the fifth transistor 240), the fifth transistor 240 may be enabled to provide a low resistance shunt path 246 (e.g., a current path), and when the inverted voltage value is a logical low value, the fifth transistor 240 may be disabled to remove (e.g., disable) the low resistance shunt path 246.

When the clamp circuit 201 is unpowered (e.g., the clamping transistor circuit 212 is operative in accordance with the first operating mode), the capacitor 216 may be at an uncharged state (e.g., substantially uncharged) and the fifth transistor 240 may be disabled. During an ESD event associated with the power supply 202, the ESD event may cause a voltage between the power supply 202 and the ground 206. The voltage value at the input node 244 (e.g., a voltage potential across the capacitor 216) may be a logical low value, and the inverter 242 may output a logical high value to the fifth transistor 240. The logical high value output by the inverter 242 enables the fifth transistor 240 to establish the low resistance shunt path 246. When the fifth transistor 240 is enabled, the clamping transistor circuit 212 is configured to shunt current from the power supply 202 to the ground 206 via the low resistance shunt path 246. In a particular embodiment, the low resistance shunt path 246 includes the fifth transistor 240, a line coupling the fifth transistor 240 to the power supply 202, and a line coupling the fifth transistor 240 to the ground 206. A resistance value of the low resistance shunt path 246 may be determined based on a size of the fifth transistor 240, and the fifth transistor 240 may be sized such that the resistance value is sufficiently low.

As current flows via the low resistance shunt path 246, a charging current may be applied to the capacitor 216 via the first charging path 210. The charging current may flow via the first charging path 210 concurrently with the current flowing via the low resistance shunt path 246. For example, the first charging path 210 may include a line (e.g., a conductor) that couples the power supply 202 to the second resistor 214 and includes the second resistor 214. After the charging current charges the capacitor 216 to a threshold charge value (e.g., a voltage to cause the inverter 242 to deactivate the fifth transistor 240), the fifth transistor 240 is disabled by the inverter 242. For example, the capacitor 216 being charged to the threshold charge value causes the voltage at the input node 244 to be a logical high value, and the inverter 242 may invert the voltage at the input node 244 and output a logical low value that disables the fifth transistor 240. Disabling the fifth transistor 240 may prohibit current flow via the low resistance shunt path 246 (e.g., disable the low resistance shunt path 246).

The first operating mode of the clamping transistor circuit may be associated with a first charging rate of the capacitor 216. The first charging rate may be determined based on a first RC time constant of the clamping transistor circuit 212. The first RC time constant may be determined based on a size of the second resistor 214, a size of the capacitor 216, or a combination thereof. In a particular embodiment, the second resistor 214 and the capacitor 216 may be sized so that the first RC time constant is set to an order of a few microseconds (μs). Such sizing of the second resistor 214 and the capacitor 216 may allow the clamping transistor circuit 212 to shunt current via the low resistance shunt path 246 during an entirety of the ESD event (e.g., an ESD event that may last less than a few μs).

During a power-up of the power supply 202 (e.g., during a power-up of the power source 252), the clamping transistor circuit 212 may operate in accordance with the second operating mode. Prior to the power-up of the power supply 202, the voltage at the second power supply 204 may reach the threshold input value (e.g., the second power source 254 has powered-up to the threshold input value). When operating in accordance with the second mode operating mode, the disable clamp circuit 208 may enable the second charging path 248 and the clamping transistor circuit 212 may receive current via the second charging path 248. The second charging path 248 may have a lower resistance than the first charging path 210. Receiving current via the second charging path 248 may modify (e.g., increase) the charging current applied to the capacitor 216 (e.g., an amount of current to the input node 244). For example, receiving current via the second charging path 248 may cause the charging current applied to the capacitor 216 to be based on the current flowing via the first charging path 210 and the current flowing via the second charging path 248. The increase in the charging current may cause the capacitor 216 to charge at a second charging rate that is faster than the first charging rate.

The second operating mode of the clamping transistor circuit may be associated with the second charging rate of the capacitor 216. The second charging rate may be determined based on a second RC time constant. For example, the second RC time constant may be determined based on the size of the second resistor 214, the capacitor 216, the second transistor 234, or a combination thereof. The second RC time constant (e.g., the time constant determined based on current flowing via the first charging path 210 and the second charging path 248) is smaller than the first RC time constant (e.g., the time constant determined based on current flowing via the first charging path 210).

Modifying the charging current applied to the capacitor 216 may prevent the clamping transistor circuit 212 from encumbering (e.g., limiting) a fast power-up of the power supply 202 (e.g., a fast power-up of the power source 252). The fast power-up of the power supply 202 may be associated with a rate of voltage increase that exceeds (e.g., is faster than) the first charging rate (e.g., the charging rate determined based on current flowing solely via the first charging path 210) of the capacitor 216. For example, the rate of voltage increase may be based on a duration of voltage increase of the power-up of the power supply 202 that is less than approximately 20 microseconds (μs). In a particular embodiment the duration of the voltage increase is approximately 30 nanoseconds (ns).

When the clamping transistor circuit 212 receives current via the second charging path 248, the capacitor 216 may charge at the second charging rate (e.g., the rate based current flowing via the first charging path 210 and the second charging path 248). The rate of voltage increase during the fast power-up does not exceed the second charging rate. For example, the second transistor 234 may be sized such that the second charging rate is faster than the rate of voltage increase during the fast power-up. Thus, the capacitor 216 may charge faster than the rate of voltage increase associated with the fast power-up and may disable the fifth transistor 240 during the fast power-up before the low resistance shunt path 246 affects the power-up. Disabling the fifth transistor 240 prevents the clamping transistor circuit 212 from shunting current via the low resistance shunt path 246 during the power-up and from encumbering (e.g., limiting) the power-up. Because the capacitor 216 is charged to the threshold charge value (e.g., the value associated with disabling the fifth transistor 240) when the fifth transistor 240 is disabled, any additional charging current applied to the capacitor 216 during the power-up does not encumber (e.g., increase power consumption or a delay) the power-up of the power supply 202.

The clamp circuit 201 may optionally include the fourth transistor 238 coupled between the clamping transistor circuit 212 and the ground 206. In a particular embodiment, the clamp circuit 201 does not include the fourth transistor 238. When the clamp circuit 201 includes the fourth capacitor 238, a drain of the fourth transistor 238 may be coupled to the output of the inverter 242 and a source of the fourth transistor 238 may be coupled to the ground 206. The fourth transistor 238 may be responsive to the voltage of the second power supply 204. For example, the gate of the fourth transistor 238 may be coupled to the voltage input node 226 (e.g., may receive the voltage of the second power supply input 204). When the voltage at the voltage input node 226 is a logical high value (e.g., above an activation threshold of the fourth transistor 238), the fourth transistor 238 may be enabled to conduct current from the output of the inverter 242 to the ground 206. The fourth transistor 238 may be configured to dissipate (e.g., reduce) a current spike that may occur during the power-up of the power supply 202. In a particular embodiment, the fourth transistor 238 is an NFET.

The circuit 200 may include the power source 252, the switch 250, the second power source 254, the ground network 207, and the clamp circuit 201. The switch 250 may be coupled to the power supply 202 and to the power source 252. In a particular embodiment, the switch 250 is a transistor, such as a positive channel field effect transistor (PFET). The switch 250 may be configured to selectively couple the power supply 202 to the power source 252 that is associated with a voltage (Vdd). For example, when the clamp circuit 201 is powered off, the switch 250 may be disabled and the power source 252 may not be coupled to the power supply 202. Enabling the switch 250 may enable the power-up of the power supply 202 from a first power state to a second power state that has a higher voltage than the first power state. For example, the power-up from the first power state to the second power state may refer to a power-up from an unpowered state to a standby state (e.g., a low power state), from the unpowered state to a normal operating state (e.g., a normal power state), or from the standby state to the normal operating state.

The power source 252 and the second power source 254 may each include a voltage source, such as a battery or an alternating current (AC) to direct current (DC) transformer, or other devices or circuits capable of providing power. For example, the second power source 254 may include a processor or may correspond to a control signal (e.g., a power supply signal). In a particular embodiment, the power source 252 and the second power source 254 are distinct power sources (e.g., the power supply 202 and the second power supply 204 correspond to distinct power sources). During operation of the clamp circuit 201, the second power source 254 may be configured to be activated (e.g., be turned on) and operate at a first voltage prior to the power source 252 being activated.

In an alternate embodiment, the second power supply 204 may be coupled to the ground network 207. When the second power supply 204 is coupled to the ground network 207, the clamping transistor circuit 212 may operate as a resistor-capacitor (RC) clamp. For example, the voltage at the second power supply 204 may remain at a logic zero value and cause the clamping transistor circuit 212 to operate in the first operating mode. Coupling the second power supply 204 to the ground network 207 may therefore provide backward compatibility with a traditional RC clamp.

In a particular embodiment, the clamp circuit 201 is included in an integrated circuit disposed on a semiconductor die (not shown) coupled to a package substrate. The ground 206 (e.g., the ground terminal of the clamp circuit 201) may be connected to the ground network 207 (e.g., a system ground) of the semiconductor die. The semiconductor die may include one or more conductive bumps (e.g., contacts and/or inputs) on a surface of the semiconductor die that are coupled to the package substrate. The one or more conductive bumps may be shorted together via a metal layer of the package substrate to create a low resistance power plane. The power supply 202 may be coupled to the one or more conductive bumps to provide a voltage (Vdd) associated with a fast power-up. The clamp circuit 201 may protect against possible damage to the clamp circuit 201 caused by an ESD event during wafer sort, manufacturing, or handling. For example, the ESD event may be caused when a handler or a testing instrument comes within close proximity of, and discharges static electricity to, the one or more conductive bumps or the metal layer of the package substrate.

During operation, the clamp circuit 201 may be unpowered and the clamping transistor circuit 212 may operate in accordance with the first operating mode (e.g., the first charging rate of the capacitor 216). For example, when the clamp circuit 201 is unpowered, the voltage of the second power supply 204 may be less than the threshold input value (e.g., less than the activation threshold associated with the first transistor 232) and the second charging path 248 may not be enabled. The capacitor 216 may be in an uncharged state and the fifth transistor 240 may be disabled. During an ESD event, the inverter 242 may invert a logical low value at the voltage input node 244 to enable the fifth transistor 240 to provide the low resistance shunt path 246. The clamping transistor circuit 212 may be configured to shunt current via the low resistance shunt path 246 and concurrently apply charging current to the capacitor 216 via the first charging path 210. The clamping transistor circuit 212 may shunt the current via the low resistance shunt path 246 until the capacitor 216 charges to the threshold charge value based on the first charging rate or until the ESD event is over. The clamping transistor circuit 212 may operate in a similar manner (e.g., in accordance with the first operating mode) when the power supply 202 has reached a steady operating voltage to prevent damage during ESD events.

During a power-up associated with the power supply 202, the clamping transistor circuit 212 may be operating in accordance with the second operating mode (e.g., the second charging rate of the capacitor 216). The power up associated with the power supply 202 (e.g., a power-up of the power source 252) may be part of a power-up sequence associated with the integrated circuit including the clamp circuit 201. For example, the power-up sequence may include powering on the second power source 254 and allowing the second power source 254 to reach a steady operating voltage. After the second power source 254 reaches the steady operating voltage, the power-up of the power source 252 may be initiated. The voltage of the second power supply 204 (e.g., the voltage received from the second power source 254) may be greater than or equal to the threshold input value prior to the power-up of the power supply 202. The disable clamp circuit 208 may enable the second charging path 248 in response to the voltage of the second power supply 204 being greater than or equal to the threshold input value. Enabling the second charging path 248 may modify charging current applied to the capacitor 216. The capacitor 216 may be charged at the second charging rate (e.g., the charging rate based on current flowing via the first charging path 210 and the second charging path 248), thereby disabling the fifth transistor 240 before current flow via the low resistance shunt path 246 affects (e.g., limits) the power-up.

The circuit 200 provides a benefit when compared to an RC clamp by changing an RC time constant of the clamping transistor circuit 212 from the first RC time constant (e.g., the RC time constant associated with charging the capacitor 216 based on current flowing via the first charging path 210) to the second RC time constant (e.g., the RC time constant associated with charging the capacitor 216 based on current flowing via the first charging path 210 and the second charging path 248). Changing the RC time constant of the clamping transistor circuit 212 may change the charging rate of the capacitor 216 and may disable the fifth transistor 240 to prevent the clamping transistor circuit 212 from shunting current via the low resistance shunt path 246 during a power-up of the power supply 202. The circuit 200 may also provide disable functionality (e.g., the disable clamp circuit 208) using an area efficient design (e.g., a small increase to the circuit area of the circuit 200). For example, the first transistor 232, the second transistor 234, and the third transistor 236 may be small compared to the inverter 242 and to the fifth transistor 240. In a particular example, the first transistor 232, the second transistor 234, and the third transistor 236 may correspond to approximately five percent or less of the circuit area of the clamping transistor circuit 212. Thus, an increase to the circuit area of the circuit 200 resulting from providing the disable functionality may be small.

Figure 3:
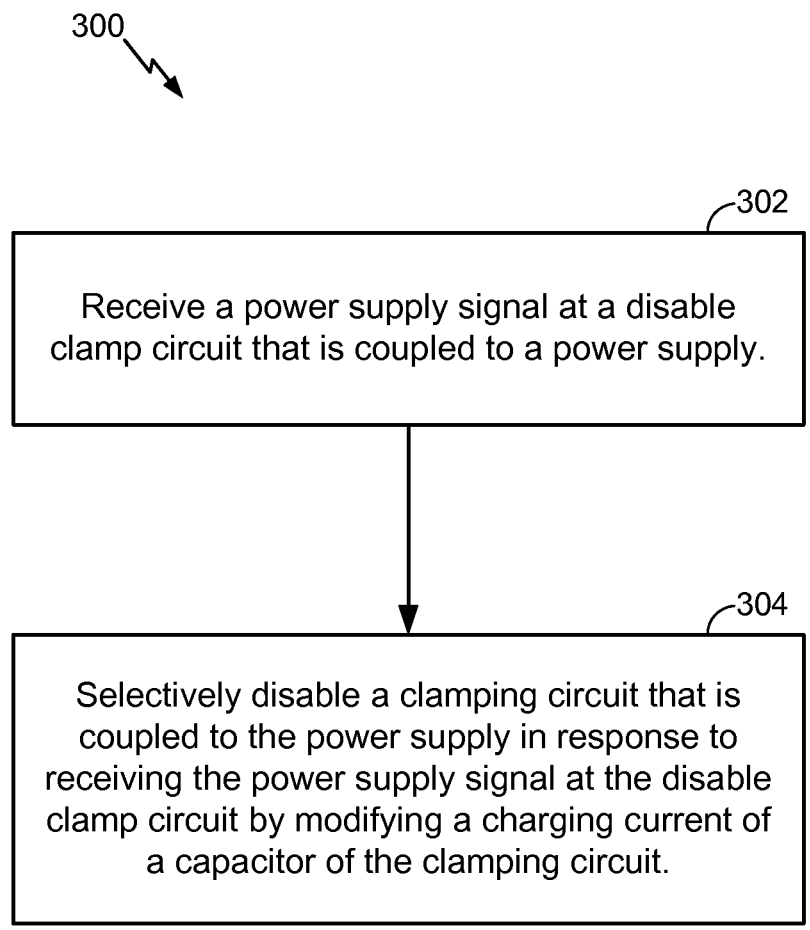
FIG. 3 is a flow diagram of a particular illustrative embodiment of a method to operate a clamping circuit and a disable clamp circuit.

Referring to FIG. 3, a flow diagram of an illustrative embodiment of a method 300 of operating a clamp circuit is illustrated. In a particular embodiment, the method 300 may be performed by the clamp circuit 100 of FIG. 1 or the clamp circuit 201 of FIG. 2.

A power supply signal may be received at a disable clamp circuit, at 302. For example, the disable clamp circuit may be the disable clamp circuit 108 of FIG. 1 or the disable clamp circuit 208 of FIG. 2. The power supply signal received at the disable clamp circuit may correspond to a voltage of the second power supply 104 or a voltage of the second power supply 204.

A clamping circuit may be selectively disabled in response to receiving the power supply signal at the disable clamping circuit by modifying charging current applied to a capacitor of the clamping circuit, at 304. For example, the clamping circuit may be the clamping transistor circuit 112 of FIG. 1 or the clamping transistor circuit 212 of FIG. 2, and the capacitor may be the capacitor 116 of FIG. 1 or the capacitor 216 of FIG. 2. The clamping circuit may be coupled to a power supply. For example, the power supply may be the power supply 102 of FIG. 1 or the power supply 202 of FIG. 2. In a particular embodiment, the clamping circuit may be disabled in response to receiving a voltage value that is greater than or equal to a threshold value via the power supply signal. In the particular embodiment, the clamping circuit may be enabled in response to receiving a voltage value that is less than the threshold via the power supply signal.

In a particular embodiment of the method 300, an output of the disable clamp circuit, such as the second node 230 of FIG. 2, may be provided to an input of the clamping circuit, such as the input node 244 of FIG. 2 (e.g., via a connector or a line). In accordance with the method 300, selective disabling of the clamping circuit may prevent the clamping circuit from encumbering a power-up of the power supply.

In a particular embodiment of the method 300, an input of the disable clamp circuit that receives the power supply signal may be coupled to ground. Coupling the input of the disable clamp circuit to ground may cause the clamping circuit to operate as a resistor-capacitor (RC) clamp circuit (e.g., a traditional RC clamp circuit without a disable clamp circuit).

The method 300 of FIG. 3 may be initiated or otherwise controlled by a field-programmable gate array (FPGA) device, an application-specific integrated circuit (ASIC), a processing unit such as a central processing unit (CPU), a digital signal processor (DSP), a controller, another hardware device, a firmware device, or any combination thereof. For example, the method 300 of FIG. 3 can be initiated by a processor 410 that executes instructions stored in a memory 432, as described with respect to FIG. 4.

Figure 4:
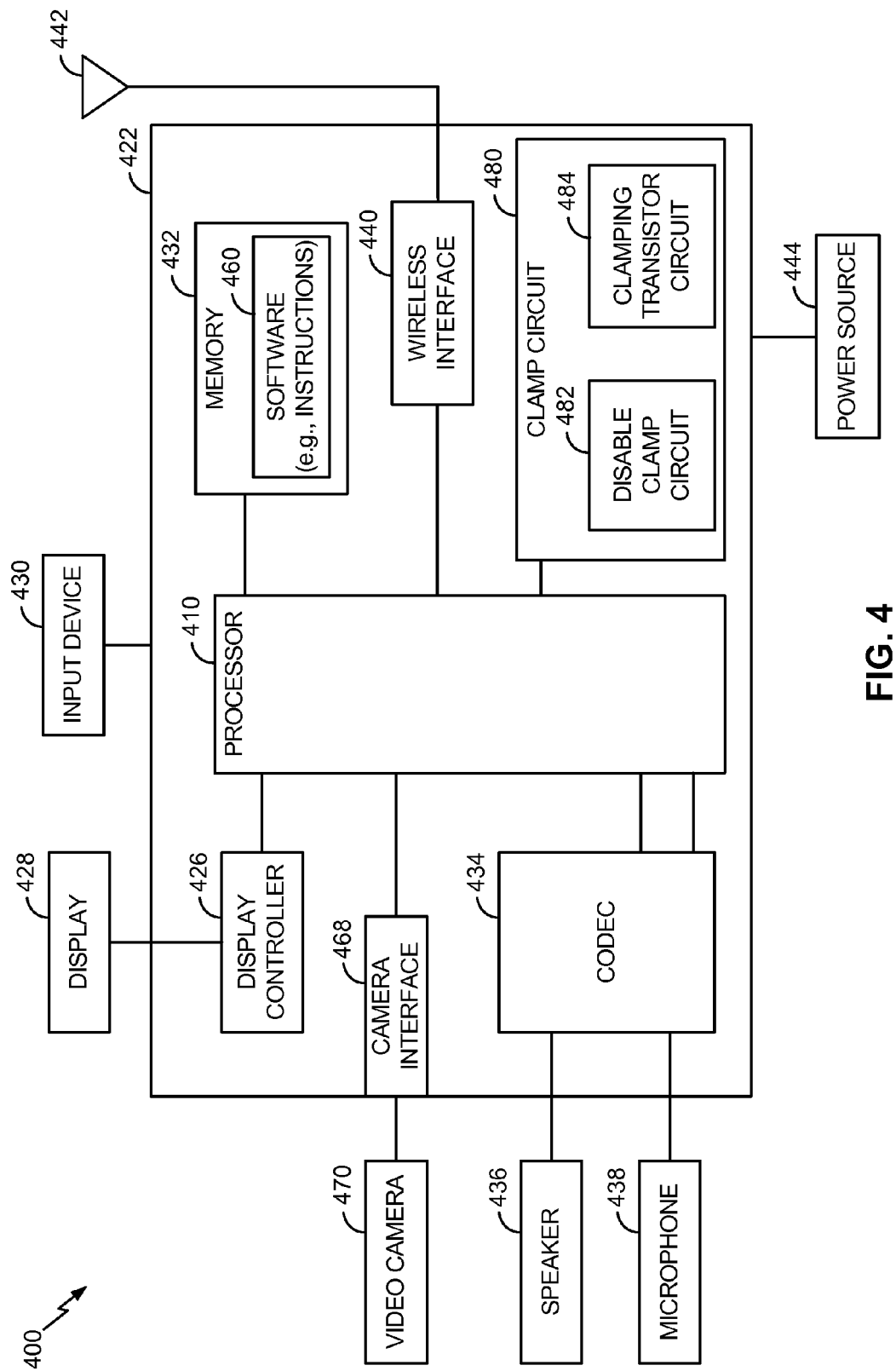
FIG. 4 is a block diagram of a particular embodiment of a wireless communication device having a clamp circuit that includes a disable circuit and a clamping transistor circuit.

FIG. 4 is a block diagram of a particular embodiment of a device 400 (e.g., a communication device) including a clamp circuit. The device 400 may be a wireless electronic device and may include a processor 410, such as a digital signal processor (DSP), coupled to a memory 432.

The processor 410 may be configured to execute software 460 (e.g., a program of one or more instructions) stored in the memory 432. The processor 410 may be coupled to a clamp circuit 480. In an illustrative embodiment, the clamp circuit 480 may include or correspond to the clamp circuit 100 of FIG. 1, the clamp circuit 201 of FIG. 2, or components thereof, may operate in accordance with the embodiment of the method of FIG. 3, or any combination thereof.

The clamp circuit 480 may be coupled to a power source 444 and include circuitry that includes a disable clamp circuit 482 and a clamping transistor circuit 484. The disable clamp circuit 482 may correspond to the disable clamp circuit 108 of FIG. 1 or the disable clamp circuit 208 of FIG. 2. The clamping transistor circuit may correspond to the clamping transistor circuit 112 of FIG. 1 or the clamping transistor circuit 212 of FIG. 2. Additionally or alternatively, at least a portion of the clamp circuit 480 may be controlled by the processor 410 executing instructions (e.g., software 460).

In a particular embodiment, the processor 410 may be configured to execute computer executable instructions (e.g., software 460) stored at a non-transitory computer readable medium, such as the memory 432, that are executable to cause a computer, such as the processor 410, to provide a disable input to the disable clamp circuit 482 coupled to a power supply. The disable input may be provided based on a second power supply. The second power supply may correspond to the second power supply 104 of FIG. 1 or the second power supply 204 of FIG. 2. The disable clamp circuit 482 is responsive to the disable input to modify a charging current applied to a capacitor of the clamping transistor circuit 484. The clamping transistor circuit 484 is coupled to the power supply and to ground. In a particular embodiment, the computer executable instructions may be further executable to cause the computer, such as the processor 410, to determine whether to assert the disable input based on a voltage associated with the second power supply. In another particular embodiment, modifying the charging current may enable charging the capacitor at a higher charging rate than a rate of charging the capacitor prior to modifying the charging current.

A camera interface 468 is coupled to the processor 410 and is also coupled to a camera, such as a video camera 470. A display controller 426 is coupled to the processor 410 and to a display device 428. A coder/decoder (CODEC) 434 can also be coupled to the processor 410. A speaker 436 and a microphone 438 can be coupled to the CODEC 434. A wireless interface 440 can be coupled to the processor 410 and to an antenna 442 such that wireless data received via the antenna 442 and the wireless interface 440 can be provided to the processor 410.

In a particular embodiment, the processor 410, the display controller 426, the memory 432, the CODEC 434, the wireless interface 440, and the camera interface 468 are included in a system-in-package or system-on-chip device 422. In a particular embodiment, an input device 430 is coupled to the system-on-chip device 422. In another particular embodiment, the power source 444 may be coupled to or included in the system-on-chip device 422. The power source 444 may correspond to the power source 252 of FIG. 2, the second power source 254 of FIG. 2, or a combination thereof. Moreover, in a particular embodiment, as illustrated in FIG. 4, the display device 428, the input device 430, the speaker 436, the microphone 438, the antenna 442, the video camera 470, and the power source 444 are external to the system-on-chip device 422. However, each of the display device 428, the input device 430, the speaker 436, the microphone 438, the antenna 442, the video camera 470, and the power source 444 can be coupled to a component of the system-on-chip device 422, such as an interface or a controller.

In conjunction with one or more of the described embodiments, an apparatus is disclosed that may include means for clamping coupled to a power supply and to ground. The means for clamping may include the clamping transistor circuit 112 of FIG. 1, the clamping transistor circuit 212 of FIG. 2, the clamping transistor circuit 484 of FIG. 4, one or more other devices or circuits configured to clamp, or any combination thereof.

The apparatus may also include means for selectively disabling the means for clamping in response to a power supply input by modifying a charging current applied to a capacitor of the means for clamping. The means for selectively disabling may be coupled to the power supply. The means for selectively disabling may include the disable clamp circuit 108 of FIG. 1, the disable clamp circuit 208 of FIG. 2, the disable clamp circuit 482 of FIG. 4, one or more other devices or circuits configured to disable the means for clamping, or any combination thereof.

One or more of the disclosed embodiments may be implemented in a system or an apparatus, such as the device 400, that may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. As another illustrative, non-limiting example, the system or apparatus may include a set top box, an entertainment unit, a navigation device, a communications device, a personal digital assistant (PDA), a fixed location data unit, a mobile location data unit, a mobile phone, a cellular phone, a satellite phone, a computer, a tablet computer, a portable computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof.

Figure 5:
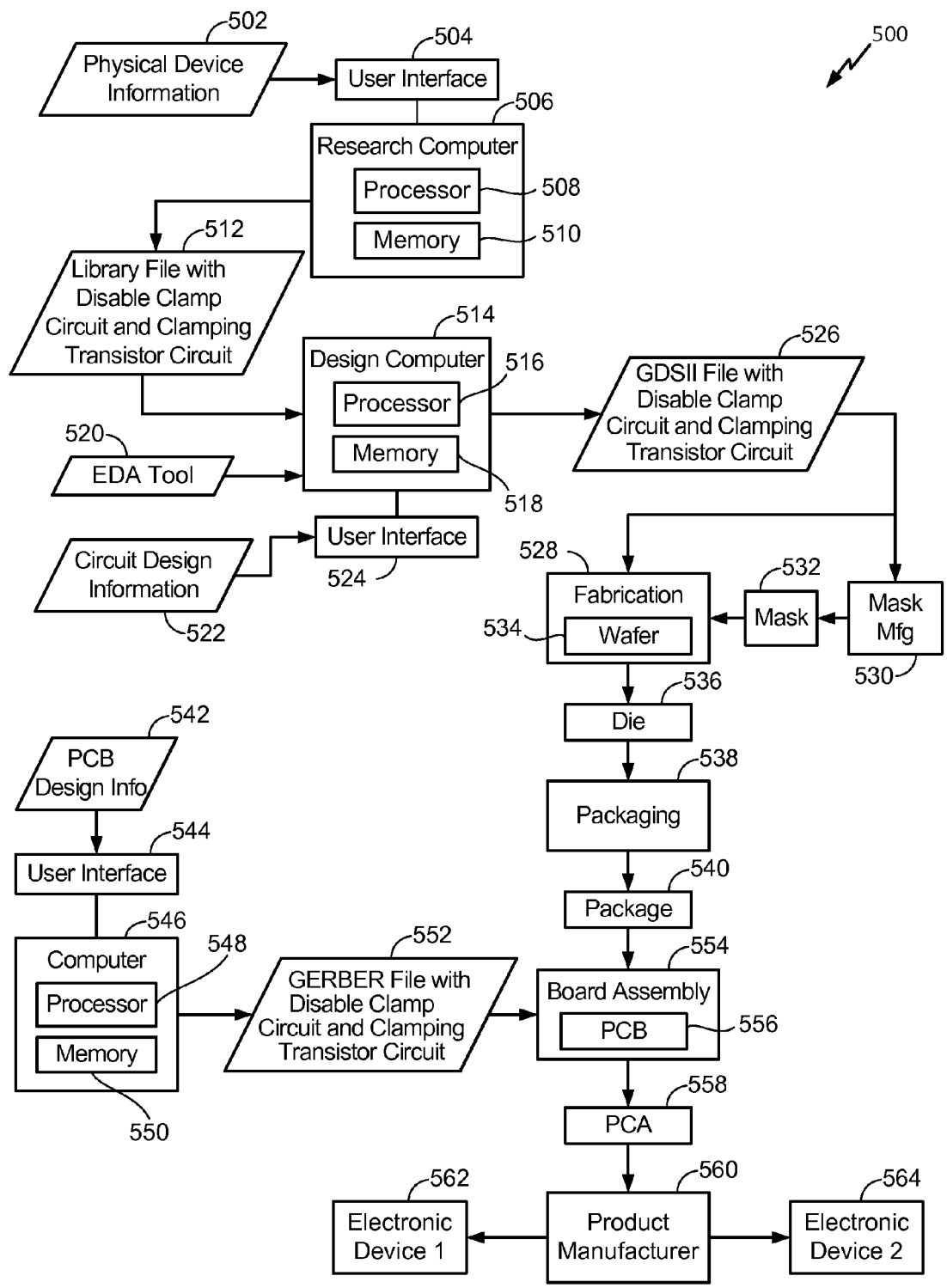
FIG. 5 is a data flow diagram of a particular illustrative embodiment of a process to manufacture one or more electronic devices that include a disable clamp circuit and a clamping transistor circuit.

The foregoing disclosed devices and functionalities may be designed and configured into computer files (e.g., RTL, Graphic Database System (GDSII), GERBER, etc.) stored on computer readable media. Some or all such files may be provided to fabrication handlers. The fabrication handlers may fabricate products and/or devices based on such files. Resulting products may include semiconductor wafers that are then cut into semiconductor die and packaged into a semiconductor chip. The semiconductor chips may then be employed in the devices described above. FIG. 5 depicts a particular illustrative embodiment of an electronic device manufacturing process 500.

Physical device information 502 may be received at the electronic device manufacturing process 500, such as at a research computer 506. The physical device information 502 may include design information representing at least one physical property of a semiconductor device, such as a clamp circuit including a disable clamp circuit and a clamping transistor circuit. The clamp circuit may correspond to the clamp circuit 100 of FIG. 1 or the clamp circuit 201 of FIG. 2, and the clamp circuit may include the disable clamp circuit 108 of FIG. 1, the disable clamp circuit 208 of FIG. 2, the clamping transistor circuit 112 of FIG. 1, the clamping transistor circuit 212 of FIG. 2, or any combination thereof. For example, the physical device information 502 may include physical parameters, material characteristics, and structure information that is entered via an interface 504 (e.g., a user interface) coupled to the research computer 506. The research computer 506 may include a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable one or more operators of the design computer 514 to design a circuit including the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, of the library file 512. For example, the one or more operators of the design computer 514 may enter circuit design information 522 via an interface 524 (e.g., a user interface) coupled to the design computer 514. The circuit design information 522 may include design information representing at least one physical property of a semiconductor device, such as the disable clamp circuit 108 of FIG. 1, the disable clamp circuit 208 of FIG. 2, the clamping transistor circuit 112 of FIG. 1, the clamping transistor circuit 212 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, in addition to other circuits or information. To illustrate, the data file may include information corresponding to a system-on-chip (SOC) that includes the disable clamp circuit 108 of FIG. 1, the disable clamp circuit 208 of FIG. 2, the clamping transistor circuit 112 of FIG. 1, the clamping transistor circuit 212 of FIG. 2, and that also includes additional electronic circuits and components within the SOC.

The GDSII file 526 may be received at a fabrication process 528 to manufacture the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the disable clamp circuit 108 of FIG. 1, the disable clamp circuit 208 of FIG. 2, the clamping transistor circuit 112 of FIG. 1, the clamping transistor circuit 212 of FIG. 2, or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as one or more Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from one or more operators of the computer 546 via an interface 544 (e.g., a user interface). The PCB design information 542 may include physical positioning information of a packaged semiconductor device on a circuit board, the packaged semiconductor device corresponding to the package 540 including the ESD clamp circuit 100 of FIG. 1, the ESD clamp circuit 201 of FIG. 2, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the disable clamp circuit 108 of FIG. 1, the disable clamp circuit 208 of FIG. 2, the clamping transistor circuit 112 of FIG. 1, the clamping transistor circuit 212 of FIG. 2, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be the device 400 of FIG. 4, into which the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, is integrated. As another illustrative, non-limiting example, one or more of the first representative electronic device 562 and the second representative electronic device 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the disable clamp circuit 108 of FIG. 1, the disable clamp circuit 208 of FIG. 2, the clamping transistor circuit 112 of FIG. 1, the clamping transistor circuit 212 of FIG. 2, or any combination thereof, may be fabricated, processed, and incorporated into an electronic device, as described in the illustrative electronic device manufacturing process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 500 may be performed by a single entity or by one or more entities performing various stages of the electronic device manufacturing process 500.

Although one or more of FIGS. 1-5 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or a combination thereof. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An illustrative storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
    a clamping transistor circuit coupled to a first power supply and to ground; and
    a disable clamp circuit coupled to the first power supply and coupled to a second power supply to receive a particular operating voltage, the disable clamp circuit responsive to the second power supply to selectively disable the clamping transistor circuit by modifying a charging current applied to a capacitor within the clamping transistor circuit.

2. The circuit of claim 1, wherein, prior to modification, the charging current is provided via a first charging path, and wherein modifying the charging current includes enabling a second charging path to the capacitor.

3. The circuit of claim 2, wherein enabling the second charging path causes additional charging current to charge the capacitor.

4. The circuit of claim 2, wherein the first charging path is coupled to the first power supply and is configured to enable charging of the capacitor, and wherein enabling the second charging path enables charging of the capacitor at a higher charging rate than a rate of charging of the capacitor via the first charging path.

5. The circuit of claim 4, wherein, when the clamping transistor circuit is operating in accordance with a first operating mode, the clamping transistor circuit remains enabled during an electrostatic discharge (ESD) event, and wherein, when the clamping transistor circuit is operating in accordance with a second operating mode, modifying the charging current disables a transistor within the clamping transistor circuit during a power-up of the first power supply.

6. The circuit of claim 2, wherein a rate of voltage increase of the first power supply during a fast power-up exceeds a first charging rate of the capacitor via the first charging path, and wherein the rate of voltage increase of the first power supply does not exceed a second charging rate of the capacitor via the first charging path and the second charging path.

7. The circuit of claim 6, wherein a duration of the voltage increase associated with the fast power-up is less than approximately 20 microseconds.

8. The circuit of claim 7, wherein the duration of the voltage increase associated with the fast power-up is approximately 30 nanoseconds.

9. The circuit of claim 1, wherein the clamping transistor circuit comprises a resistor-capacitor (RC) clamp circuit.

10. The circuit of claim 1, wherein the disable clamp circuit comprises:
    a first transistor coupled between a first node and ground, the first transistor responsive to the second power supply;
    a second transistor coupled between the first power supply and a second node, the second transistor responsive to a voltage of the first node; and
    a third transistor coupled between the first power supply and the first node, the third transistor responsive to a voltage of the second node, wherein the second node is coupled to the clamping transistor circuit.

11. The circuit of claim 10, wherein the first transistor is a negative channel field effect transistor (NFET), and wherein the second transistor and the third transistor are positive channel field effect transistors (PFETs).

12. The circuit of claim 1, further comprising a fourth transistor coupled between the clamping transistor circuit and ground, wherein the fourth transistor is responsive to the second power supply.

13. The circuit of claim 1, wherein the first power supply and the second power supply correspond to distinct power sources.

14. The circuit of claim 1, wherein the clamping transistor circuit and the disable clamp circuit are included in an integrated circuit that is disposed on a semiconductor die, and wherein a plurality of conductive bumps on a surface of the semiconductor die are coupled to a metal layer of the semiconductor die.

15. The circuit of claim 1, wherein an area of the disable clamp circuit is less than or equal to approximately five percent of an area of the clamping transistor circuit.

16. A method comprising:
    receiving a second power supply signal at a disable clamp circuit that is coupled to a first power supply; and
    selectively disabling a clamping circuit that is coupled to the first power supply in response to receiving the second power supply signal at the disable clamp circuit by modifying a charging current applied to a capacitor of the clamping circuit, wherein the second power supply signal corresponds to a particular operating voltage of a second power supply.

17. The method of claim 16, further comprising providing an output of the disable clamp circuit to an input of the clamping circuit.

18. The method of claim 16, wherein the clamping circuit is disabled in response to receiving a voltage value that is greater than or equal to a threshold value via the second power supply signal.

19. The method of claim 18, wherein the clamping circuit is enabled in response to receiving a voltage value that is less than the threshold value via the second power supply signal.

20. The method of claim 19, wherein, in response to being enabled, the clamping circuit is operable to shunt current from the first power supply to ground via a low resistance shunt path.

21. The method of claim 16, wherein selectively disabling the clamping circuit prevents the clamping circuit from encumbering a fast power-up of the first power supply.

22. The method of claim 21, wherein encumbering the fast power-up includes increasing a power consumption, a delay, or a combination thereof associated with the fast power-up.

23. The method of claim 16, further comprising coupling an input of the disable clamp circuit that receives the second power supply signal to ground, wherein coupling the input to ground causes the clamping circuit to operate as a resistor-capacitor (RC) clamp.

24. An apparatus comprising:
    means for clamping coupled to a first power supply and to ground; and
    means for selectively disabling the means for clamping in response to a second power supply input by modifying a charging current applied to a capacitor of the means for clamping, wherein the means for selectively disabling is coupled to the first power supply and is coupled to a second power supply to receive a particular operating voltage from the second power supply.

25. The apparatus of claim 24, wherein the means for clamping provides a low resistance shunt path between the first power supply and ground, and wherein, in response to being enabled, the means for clamping is operable to shunt current from the first power supply to ground via the low resistance shunt path during an electrostatic discharge (ESD) event.

26. The apparatus of claim 24, wherein, prior to modification, the charging current is provided by a first charging path, wherein modifying the charging current enables a second charging path to the capacitor, and wherein enabling the second charging path enables charging of the capacitor at a higher charging rate than a rate of charging of the capacitor via the first charging path.

27. The apparatus of claim 24, wherein the means for selectively disabling is configured to prevent the means for clamping from encumbering a fast power-up of the first power supply.

28. A non-transitory computer readable medium comprising instructions that, when executed by a processor, cause the processor to:
- provide, to a disable clamp circuit coupled to a first power supply and to ground, a disable signal based on a second power supply, wherein a particular operating voltage is associated with the second power supply;
- wherein a clamping transistor circuit is coupled to the first power supply and to ground; and
- wherein the disable clamp circuit is responsive to the disable signal to modify a charging current applied to a capacitor of the clamping transistor circuit.

29. The non-transitory computer readable medium of claim 28, further comprising instructions that, when executed by the processor, cause the processor to determine whether to assert the disable signal based on the particular operating voltage associated with the second power supply.

30. The non-transitory computer readable medium of claim 28, wherein modifying the charging current enables charging of the capacitor at a higher charging rate than a rate of charging of the capacitor prior to modifying the charging current.

* * * * *